United States Patent
Paranthaman et al.

(10) Patent No.: US 7,258,928 B2
(45) Date of Patent: Aug. 21, 2007

(54) DOPED $Y_2O_3$ BUFFER LAYERS FOR LAMINATED CONDUCTORS

(75) Inventors: Mariappan Parans Paranthaman, Knoxville, TN (US); Urs Schoop, Westborough, MA (US); Amit Goyal, Knoxville, TN (US); Cornelis Leo Hans Thieme, Westborough, MA (US); Darren T. Verebelyi, Oxford, MA (US); Martin W. Rupich, Framingham, MA (US)

(73) Assignees: UT-Battelle, LLC, Oak Ridge, TN (US); American Superconductor, Westborough, MA (US)

( * ) Notice: Subject to any disclaimer, the term of this patent is extended or adjusted under 35 U.S.C. 154(b) by 3 days.

(21) Appl. No.: 11/192,488

(22) Filed: Jul. 29, 2005

(65) Prior Publication Data

US 2007/0026248 A1 Feb. 1, 2007

(51) Int. Cl.
*B32B 15/04* (2006.01)
*B32B 9/00* (2006.01)

(52) U.S. Cl. .................. 428/469; 428/701; 428/702

(58) Field of Classification Search .............. None
See application file for complete search history.

(56) References Cited

U.S. PATENT DOCUMENTS

| | | | |
|---|---|---|---|
| 5,595,960 A | 1/1997 | Belouet et al. | |
| 6,077,344 A | 6/2000 | Shoup et al. | |
| 6,150,034 A | 11/2000 | Paranthaman et al. | |
| 6,156,376 A * | 12/2000 | Paranthaman et al. | ... 427/126.3 |
| 6,159,610 A | 12/2000 | Paranthaman et al. | |
| 6,235,402 B1 | 5/2001 | Shoup et al. | |
| 6,270,908 B1 | 8/2001 | Williams et al. | |
| 6,399,154 B1 | 6/2002 | Williams et al. | |
| 6,428,920 B1 | 8/2002 | Badding et al. | |
| 6,440,211 B1 | 8/2002 | Beach et al. | |
| 6,537,689 B2 * | 3/2003 | Schoop et al. | .............. 428/701 |
| 6,596,421 B2 * | 7/2003 | Schmidt et al. | ............. 428/701 |
| 6,649,570 B2 | 11/2003 | Belouet | |
| 6,663,976 B2 | 12/2003 | Beach et al. | |
| 2005/0217568 A1* | 10/2005 | Rupich et al. | .............. 117/101 |

OTHER PUBLICATIONS

C.C. Wang, et al., "Effect of zirconia doping on the electrical behavior of yttria," J of Materials Research, 1996, pp. 422-429, vol. 11, No. 2.

* cited by examiner

*Primary Examiner*—Jennifer McNeil
*Assistant Examiner*—Jonathan Langman
(74) *Attorney, Agent, or Firm*—Joseph A. Maraseo

(57) ABSTRACT

A laminated conductor includes a metallic substrate having a surface, a biaxially textured buffer layer supported by the surface of the metallic substrate, the biaxially textured buffer layer comprising $Y_2O_3$ and a dopant for blocking cation diffusion through the $Y_2O_3$, and a biaxially textured conductor layer supported by the biaxially textured buffer layer.

44 Claims, 3 Drawing Sheets

DOPED $Y_2O_3$ BUFFER LAYERS FOR LAMINATED CONDUCTORS

The United States Government has rights in this invention pursuant to contract no. DE-AC05-00OR22725 between the United States Department of Energy and UT-Battelle, LLC.

FIELD OF THE INVENTION

The present invention relates to layered conductors having biaxially textured buffer layers supporting a conducting layer such as a superconductor, a ferroelectric, piezoelectric or other semiconductor, and more particularly to such layered conductors having doped $Y_2O_3$ buffer layers.

BACKGROUND OF THE INVENTION

Buffer layers play a key role in high-temperature superconductor (HTS) materials, particularly in recently developed second-generation rare-earth-barium-copper-oxide (REBCO), especially yttrium-barium-copper-oxide (YBCO) wire technology. The purpose of the buffer layers is to provide a continuous, smooth and chemically inert surface for the growth of the YBCO film, while transferring the biaxial texture from the substrate to the YBCO. Buffer layers are important for preventing metal diffusion from the substrate into the superconductor, and as oxygen diffusion barriers. Multi-layer architectures have been developed that also provide mechanical stability and good adhesion to the substrate.

The following patents provide ample background teaching and are incorporated herein by reference:

U.S. Pat. No. 6,663,976 issued on Dec. 16, 2003 to D. B. Beach, J. S. Morrell, M. Paranthaman, T. Chirayil, E. D. Specht, and A. Goyal, "Laminate articles on biaxially textured metal substrates".

U.S. Pat. No. 6,399,154 issued on Jun. 4, 2002 to R. K. Williams, M. Paranthaman, T. G. Chirayil, D. F. Lee, A. Goyal, and R. Feenstra, entitled "Laminate Article".

U.S. Pat. No. 6,440,211 issued on Aug. 27, 2002 to D. B. Beach, J. S. Morrell, M. Paranthaman, T. G. Chirayil, E. D. Specht, and A. Goyal, entitled "Method of Depositing Buffer Layers on Biaxially Textured Metal Substrates".

U.S. Pat. No. 6,235,402 issued on May 22, 2001 to S. S. Shoup, M. Paranthaman, D. B. Beach, D. M. Kroeger, and A. Goyal, entitled "Buffer Layers on Biaxially Textured Metal Substrates".

U.S. Pat. No. 6,270,908 issued on Aug. 7, 2001 to R. K. Williams, M. Paranthaman, T. G. Chirayil, D. F. Lee, A. Goyal, and R. Feenstra, entitled "Rare Earth Zirconium Oxide Buffer Layers on Metal Substrate".

U.S. Pat. No. 6,077,344 issued on Jun. 20, 2000 to S. S. Shoup, M. Paranthaman, D. B. Beach, D. M. Kroeger, and A. Goyal, entitled "Sol-gel Deposition of Buffer Layers on Biaxially Textured Metal Substances".

U.S. Pat. No. 6,150,034 issued on Nov. 21, 2000 to M. Paranthaman, D. F. Lee, D. M. Kroeger, and A. Goyal, entitled "Buffer Layers on Rolled Nickel or Copper as Superconductor Substrates"

U.S. Pat. No. 6,156,376 issued on Dec. 5, 2000 to M. Paranthaman, D. F. Lee, D. M. Kroeger, and A. Goyal, entitled "Buffer Layers on Metal Surfaces Having Biaxial Texture as Superconductor Substrates".

U.S. Pat. No. 6,159,610 issued on Dec. 12, 2000 to M. Paranthaman, D. F. Lee, D. M. Kroeger, and A. Goyal, entitled "Buffer Layers on Metal Surfaces Having Biaxial Texture as Superconductor Substrates".

It is important that the highly aligned buffer materials are matched in both the lattice constant and thermal expansion to the biaxially textured substrate and the YBCO layer. The buffer layers should be smooth, continuous, crack-free and dense. Even though the buffer layers are much thinner than the YBCO layer, buffer deposition cost is a substantial part of the total conductor cost. Hence, there is a need for the development of economically feasible, efficient, scaleable, high rate, high quality buffer layers and associated deposition processes.

When growing an epitaxial oxide film on a metal surface it is essential to avoid oxide formation before the nucleation of the layer is complete. For example YBCO is typically grown in an atmosphere containing 100 ppm or more of oxygen at 700-800° C. Under such conditions Ni and W will form various native oxides on a NiW surface, i.e. at PO2 levels below the required PO2 levels to oxidize Ni or W. Most of such oxide layers do not offer the bi-axial cubic texture required for high critical currents in the HTS layer. However, the ability of certain oxide films to be grown in very low oxygen partial pressures, i.e. below the oxidation of Ni and even W can be utilized. A thin seed layer is deposited first, to subsequently allow the growth of the full buffer and finally the YBCO processing at higher oxygen levels.

Oxide diffusion in most films is rather fast compared to cation diffusion. In reality the oxidation of the metal substrate cannot be suppressed completely. Thin homogeneous oxide layers are observed after final processing of the conductor without negative impact on the performance. However the buffer stack controls the amount and the time when the oxide layer is formed at the interface between the buffer and the substrate. Uncontrolled growth of substrate oxides can result in multiple failures. Rapid and inhomogeneous oxide growth can penetrate the buffer layers and cause a break down of its barrier properties. For example, when excessive NiO is formed the full buffer stack delaminates from the metal template due to volume expansion of, for example, Ni to NiO.

Fundamental understanding of the oxygen diffusion through oxide buffers is under study. Even though it is possible to grow oxide buffers directly on textured metal surfaces under suitable reducing conditions, oxygen penetrates through the buffer layers such as yttrium oxide, cerium oxide, and yttria-stabilized zirconia (YSZ) to the metal oxide interface during the YBCO processing. This is mainly because the oxygen diffusivity of these buffers at 800° C. is in the range of $10^{-9}$ to $10^{-10}$ cm$^2$/sec. The diffusion is more rapid in structures that are more prone to the occurrence of defects. Among fastest oxygen diffusion is that of YSZ, which has a fluorite structure with a high probability of oxygen vacancies, providing easier routes for oxygen transport. Grain boundaries, pinholes and particulates can also provide short circuit diffusion paths in these films.

Referring to FIG. 1, some commonly used architectures begin with a starting template such as a rolling-assisted biaxially textured substrate (RABiTS) 1 comprising Ni—W (3 or 5 at. %). Layers include, for example, a buffer layer 2 of $Y_2O_3$ (75 nm), a barrier layer 3 of YSZ (75 nm), a capping layer 4 of $CeO_2$ (75 nm), and a layer of REBCO 5. RE is Y or another rare earth element alone or doped with another rare earth element. Layer 4 could alternatively comprise a ferroelectric, piezoelectric or another semiconductor material. The buffers are generally deposited using physical vapor deposition (PVD) techniques.

The thickness of the YSZ layer is determined by the oxidation of the underlying substrate/buffer interface during the buffer deposition and the subsequent processing of the YBCO layer in highly oxidizing atmosphere. The cost of the buffer layer deposition corresponds to the total processing time. Thus it is necessary to develop a very fast deposition process (>10 Å/s) if thick layers (~200 nm) are needed. Fast deposition rates impact the morphology and density of the growing film, which potentially increases the required thickness again. There is a need to reduce the required thickness and/or reduce the number of buffer layers in order to relax the requirements on the deposition rates and allow for a significant cost reduction.

OBJECTS OF THE INVENTION

Accordingly, objects of the present invention include provision of a YBCO conductor architecture that has a reduced required thickness and/or reduced number of buffer layers in order to relax the requirements on the deposition rates and allow for a significant cost reduction. Further and other objects of the present invention will become apparent from the description contained herein.

SUMMARY OF THE INVENTION

In accordance with one aspect of the present invention, the foregoing and other objects are achieved by a laminated conductor that includes a metallic substrate having a surface, a biaxially textured buffer layer supported by the surface of the metallic substrate, the biaxially textured buffer layer comprising $Y_2O_3$ and a dopant for blocking cation diffusion through the $Y_2O_3$, and a biaxially textured conductor layer supported by the biaxially textured buffer layer.

In accordance with another aspect of the present invention, a laminated conductor includes a metallic substrate having a biaxially textured surface, a biaxially textured buffer layer supported by and in contact with the biaxially textured surface of the metallic substrate, the biaxially textured buffer layer comprising $Y_2O_3$ and a dopant for blocking cation diffusion through the $Y_2O_3$, a biaxially textured $CeO_2$ capping layer supported by the biaxially textured buffer layer; and a biaxially textured conductor layer supported by and in contact with the biaxially textured $CeO_2$ capping layer.

For a better understanding of the present invention, together with other and further objects, advantages and capabilities thereof, reference is made to the following disclosure and appended claims in connection with the above-described drawings.

DETAILED DESCRIPTION OF THE INVENTION

The present invention serves to improve the performance of physical vapor deposited (PVD) conductor architectures through at least one of: reducing the thickness of some of the buffer layers or exchanging; and eliminating one or more of the layers altogether. PVD includes, but is not limited to, evaporation, reactive evaporation deposition (RED), chemical vapor deposition (CVD), sputtering, pulsed laser deposition (PLD), pulsed electron deposition (PED), electrodeposition, spray pyrolysis, and metal-organic chemical vapor deposition (MOCVD).

The present invention is also applicable to chemical solution deposition (CSD) deposition methods, including but not limited to metal-organic deposition (MOD), sol gel, and polymeric precursor routes.

A $Y_2O_3$ seed layer is a good oxygen diffusion barrier layer but not a good Ni cation diffusion barrier layer. YSZ barrier layer has been identified as a good metal diffusion barrier layer but not a good oxygen diffusion barrier layer and can be eliminated in some embodiments of the present invention.

Controlled doping of the $Y_2O_3$ buffer layer in accordance with the present invention reduces the diffusivity of metal (especially cation) atoms therein. Enhanced barrier properties of the bulk material enable the use of thinner buffer layers. The dopant concentration is greater at defect sites such as dislocations, grain boundaries, etc. compared to the bulk. Since the unwanted cation diffusion is much faster along such defects than in the bulk, the doping of the $Y_2O_3$ buffer layer is especially advantageous.

Moreover, doping the $Y_2O_3$ buffer layer can enhance the growth mode thereof, thus enhancing the defect structure of the film. Thus, the $Y_2O_3$ buffer layer can do double-duty, suppressing the defect mediated diffusion of both oxygen and metal atoms for example at grain boundaries and reducing or eliminating the need for a YSZ layer.

Figure 1:
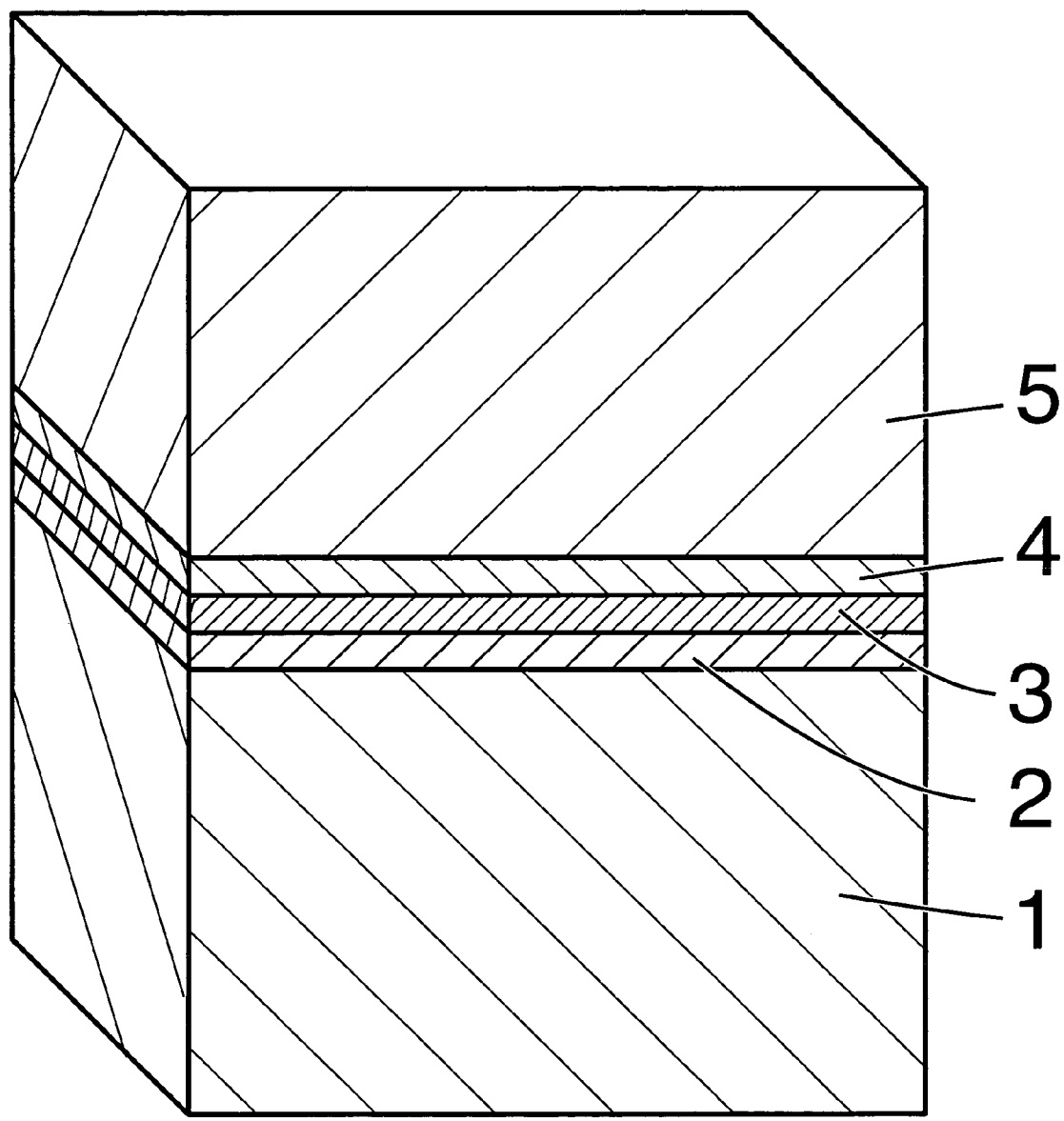
FIG. 1 is a schematic illustration of a typical YBCO coated conductor having five layers of various materials.
Figure 2:
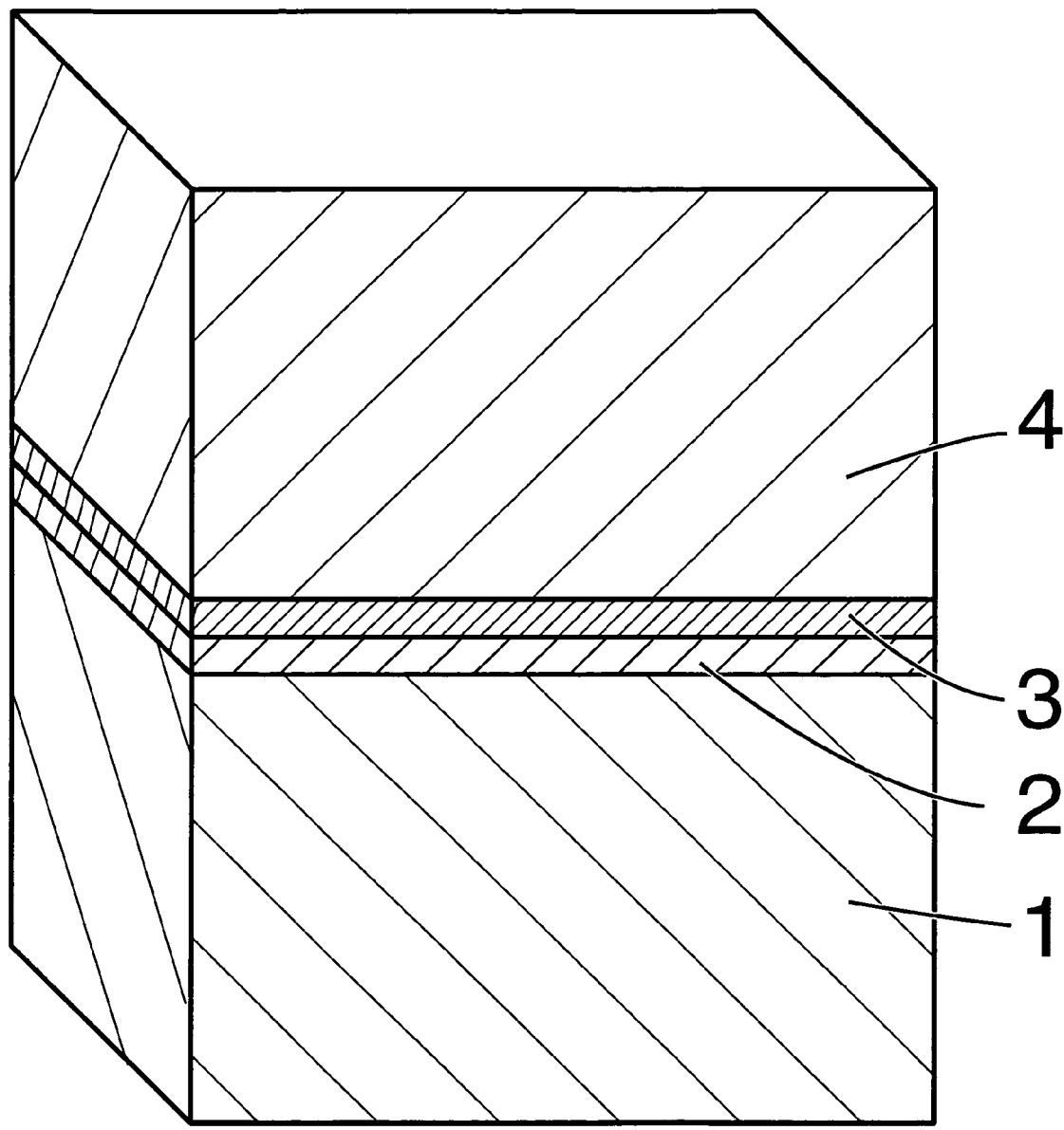
FIG. 2 is a schematic illustration of a typical YBCO coated conductor having four layers of various materials.

Referring to FIG. 1, some embodiments of the invention involve a substrate 1, doped $Y_2O_3$ buffer layer 2, a YSZ buffer layer 3, a $CeO_2$ capping layer 4, and a YBCO superconductor layer 5. Referring to FIG. 2, other embodiments of the invention involve a substrate 1, doped $Y_2O_3$ buffer layer 2, a $CeO_2$ capping layer 3, and a REBCO superconductor layer 4, such as YBCO. There may be other layers in between the described layers.

In accordance with the present invention a dopant is introduced into $Y_2O_3$ to enhance the barrier properties thereof. Suitable dopants include, but are not limited to: Eu, Nd, Er, Yb, Th, Ce, Ba, Ca, Al, Tm, Sr, Dy, Gd, Ho, La, Pd, Pt, Pr, Sm, and Zr. The concentration of dopant that is introduced into the $Y_2O_3$ buffer layer is operably in the range of at least 0.1 mole % and no more than 50 mole %, preferably in the range of at least 0.5 mole % and no more than 15 mole %, more preferably in the range of at least 1 mole % and no more than 10 mole %, most preferably in the range of at least 3 mole % and no more than 7 mole %.

In determining the proper concentration of a particular dopant, the skilled artisan will recognize that one must consider the role of the dopant—specifically the blocking of cation diffusion through the $Y_2O_3$ buffer layer. Minimal testing will show that too little dopant will result in insufficient blocking of cation diffusion through the $Y_2O_3$ buffer layer, and that too much dopant will cause deleterious effects such as, for example, phase instability and/or negative effects on oxygen diffusion barrier properties of the $Y_2O_3$ buffer layer.

EXAMPLE

Figure 3:
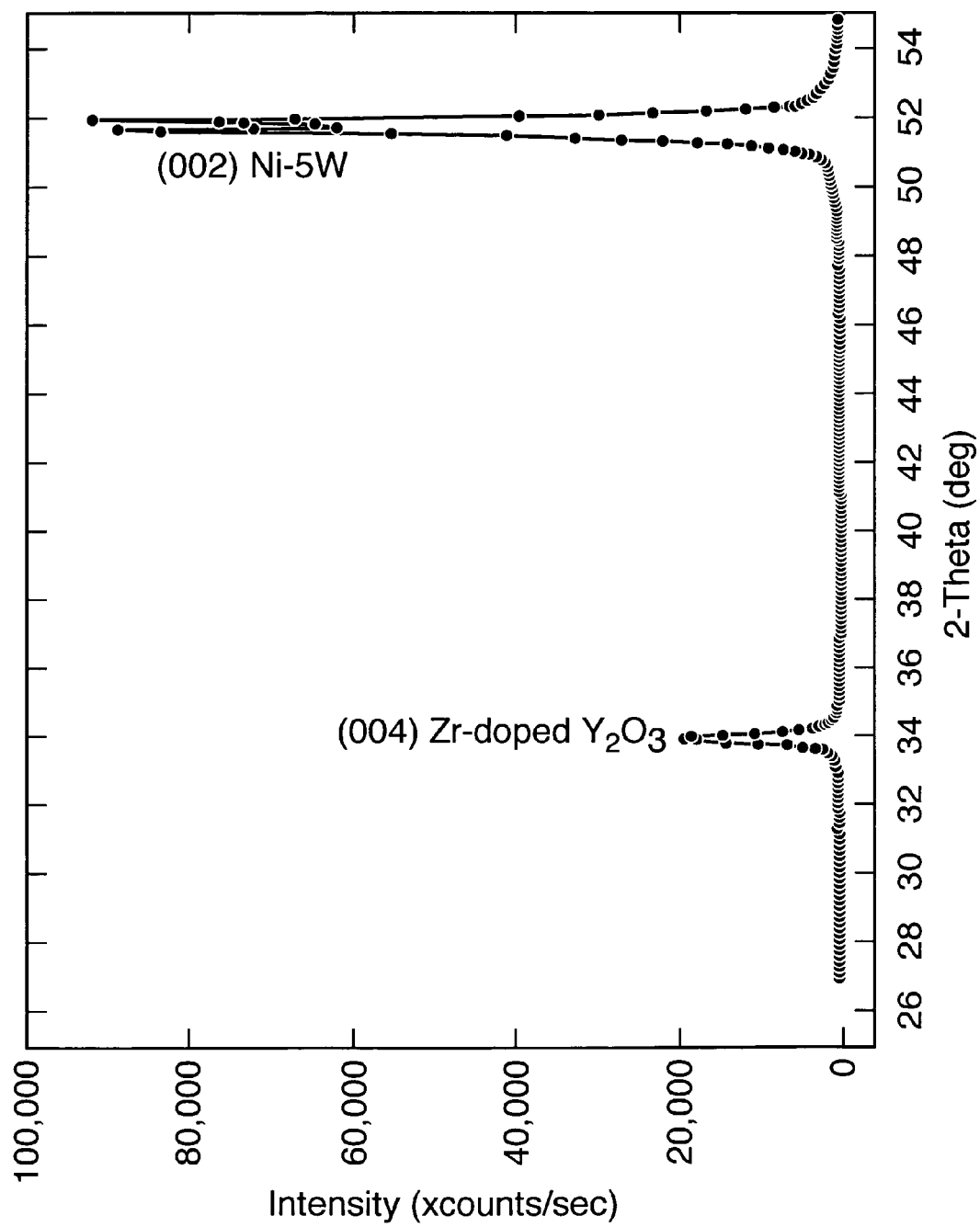
FIG. 3 is an infrared spectrum of a Zr-doped Y2O3 film grown epitaxially on a biaxially textured Ni-5W substrate.

Zr (~5 mole %) doped $Y_2O_3$ layers were deposited on Ni—W alloy RABiTS substrates using RED. In this case, a single alloy target of Zr doped Y was used. It is also possible to co-evaporate both Zr and Y to control independently the stoichiometry of Zr in $Y_2O_3$. FIG. 3 shows an infrared spectrum of the result.

The present invention is applicable to all other types of conducting layers such as ferroelectric, piezoelectric and/or other semiconductors.

While there has been shown and described what are at present considered the preferred embodiments of the invention, it will be obvious to those skilled in the art that various changes and modifications can be prepared therein without departing from the scope of the inventions defined by the appended claims.

What is claimed is:

1. A laminated conductor comprising:
   a. a metallic substrate having a surface;
   b. a biaxially textured buffer layer supported by said surface of said metallic substrate, said biaxially textured buffer layer comprising $Y_2O_3$ and a dopant for blocking cation diffusion through said $Y_2O_3$, said dopant comprising at least one element selected from the group consisting of Al, Pd, Pt, and Zr; and
   c. a biaxially textured conductor layer supported by said biaxially textured buffer layer.

2. A laminated conductor in accordance with claim 1 wherein said metallic substrate is biaxially textured.

3. A laminated conductor in accordance with claim 2 wherein said biaxially textured buffer layer is in contact with said biaxially textured surface of said substrate.

4. A laminated conductor in accordance with claim 1 wherein said biaxially textured conductor layer is in contact with said biaxially textured buffer layer.

5. A laminated conductor in accordance with claim 1 further comprising a biaxially textured YSZ buffer layer between said biaxially textured buffer layer and said biaxially textured conductor layer.

6. A laminated conductor in accordance with claim 5 wherein said biaxially textured YSZ buffer layer is in contact with said biaxially textured buffer layer.

7. A laminated conductor in accordance with claim 5 wherein said biaxially textured conductor layer is in contact with said biaxially YSZ buffer layer.

8. A laminated conductor in accordance with claim 1 further comprising a biaxially textured $CeO_2$ capping layer between said biaxially textured buffer layer and said biaxially textured conductor layer.

9. A laminated conductor in accordance with claim 8 wherein said biaxially textured $CeO_2$ capping layer is in contact with said biaxially textured buffer layer.

10. A laminated conductor in accordance with claim 8 wherein said biaxially textured conductor layer is in contact with said biaxially textured $CeO_2$ capping layer.

11. A laminated conductor in accordance with claim 8 further comprising a biaxially textured YSZ buffer layer between said biaxially textured buffer layer and said biaxially textured $CeO_2$ capping layer.

12. A laminated conductor in accordance with claim 11 wherein said biaxially textured YSZ buffer layer is in contact with said biaxially textured buffer layer.

13. A laminated conductor in accordance with claim 11 wherein said biaxially textured $CeO_2$ capping layer is in contact with said biaxially textured YSZ buffer layer.

14. A laminated conductor in accordance with claim 1 wherein said dopant is present in a concentration in the range of about 0.1 to about 50 mole %.

15. A laminated conductor in accordance with claim 14 wherein said dopant is present in a concentration in the range of about 0.5 to about 20 mole %.

16. A laminated conductor in accordance with claim 15 wherein said dopant is present in a concentration in the range of about 1 to about 10 mole %.

17. A laminated conductor in accordance with claim 16 wherein said dopant is present in a concentration in the range of about 3 to about 7 mole %.

18. A laminated conductor in accordance with claim 1 wherein said biaxially textured conductor layer comprises a REBCO superconductor.

19. A laminated conductor comprising:
    a. a metallic substrate having a biaxially textured surface;
    b. a biaxially textured buffer layer supported by and in contact with said biaxially textured surface of said metallic substrate, said biaxially textured buffer layer comprising $Y_2O3$ and a dopant for blocking cation diffusion through said $Y_2O_3$, said dopant comprising at least one element selected from the group consisting of Al, Pd, Pt, and Zr;
    c. a biaxially textured $CeO_2$ capping layer supported by said biaxially textured buffer layer; and
    d. a biaxially textured conductor layer supported by and in contact with said biaxially textured $CeO_2$ capping layer.

20. A laminated conductor in accordance with claim 19 wherein said biaxially textured $CeO_2$ capping layer is in contact with said biaxially textured buffer layer.

21. A laminated conductor in accordance with claim 19 further comprising a biaxially textured YSZ buffer layer between said biaxially textured buffer layer and said biaxially textured $CeO_2$ capping layer.

22. A laminated conductor in accordance with claim 21 wherein said biaxially textured YSZ buffer layer is in contact with said biaxially textured buffer layer.

23. A laminated conductor in accordance with claim 22 wherein said biaxially textured $CeO_2$ capping layer is in contact with said biaxially textured YSZ buffer layer.

24. A laminated conductor in accordance with claim 19 wherein said dopant is present in a concentration in the range of about 0.1 to about 50 mole %.

25. A laminated conductor in accordance with claim 24 wherein said dopant is present in a concentration in the range of about 0.5 to about 20 mole %.

26. A laminated conductor in accordance with claim 25 wherein said dopant is present in a concentration in the range of about 1 to about 10 mole %.

27. A laminated conductor in accordance with claim 26 wherein said dopant is present in a concentration in the range of about 3 to about 7 mole %.

28. A laminated conductor in accordance with claim 19 wherein said biaxially textured conductor layer comprises a REBCO superconductor.

29. A laminated conductor comprising:
    a. a metallic substrate having a surface;
    b. a biaxially textured seed layer supported by and in contact with said surface of said metallic substrate, said biaxially textured seed layer comprising $Y_2O_3$ and a dopant for blocking cation diffusion through said $Y_2O_3$, said dopant comprising at least one element selected from the group consisting of Ba, Ca, Al, Sr, Pd, Pt, and Zr;

c. a biaxially textured buffer layer supported by said biaxially textured seed layer; and d. a biaxially textured conductor layer supported by said biaxially textured buffer layer.

30. A laminated conductor in accordance with claim 29 wherein said metallic substrate is biaxially textured.

31. A laminated conductor in accordance with claim 29 wherein said biaxially textured buffer layer comprises YSZ.

32. A laminated conductor in accordance with claim 31 wherein said biaxially textured YSZ buffer layer is in contact with said biaxially textured seed layer.

33. A laminated conductor in accordance with claim 31 wherein said biaxially textured conductor layer is in contact with said biaxially YSZ buffer layer.

34. A laminated conductor in accordance with claim 29 wherein said biaxially textured buffer layer comprises a $CeO_2$ capping layer.

35. A laminated conductor in accordance with claim 34 wherein said biaxially textured $CeO_2$ capping layer is in contact with said biaxially textured seed layer.

36. A laminated conductor in accordance with claim 34 wherein said biaxially textured conductor layer is in contact with said biaxially textured $CeO_2$ capping layer.

37. A laminated conductor in accordance with claim 34 further comprising a biaxially textured YSZ buffer layer between said biaxially textured seed layer and said biaxially textured $CeO_2$ capping layer.

38. A laminated conductor in accordance with claim 37 wherein said biaxially textured YSZ buffer layer is in contact with said biaxially textured seed layer.

39. A laminated conductor in accordance with claim 37 wherein said biaxially textured $CeO_2$ capping layer is in contact with said biaxially textured YSZ buffer layer.

40. A laminated conductor in accordance with claim 29 wherein said dopant is present in a concentration in the range of about 0.1 to about 50 mole %.

41. A laminated conductor in accordance with claim 40 wherein said dopant is present in a concentration in the range of about 0.5 to about 20 mole %.

42. A laminated conductor in accordance with claim 41 wherein said dopant is present in a concentration in the range of about 1 to about 10 mole %.

43. A laminated conductor in accordance with claim 42 wherein said dopant is present in a concentration in the range of about 3 to about 7 mole %.

44. A laminated conductor in accordance with claim 29 wherein said biaxially textured conductor layer comprises a REBCO superconductor.

* * * * *